United States Patent
Edwards et al.

(10) Patent No.: US 12,389,640 B2
(45) Date of Patent: Aug. 12, 2025

(54) HIGH VOLTAGE AVALANCHE DIODE FOR ACTIVE CLAMP DRIVERS

(71) Applicant: Texas Instruments Incorporated, Dallas, TX (US)

(72) Inventors: Henry Litzmann Edwards, Garland, TX (US); Joseph Maurice Khayat, Bedford, NH (US); Archana Venugopal, Mountain View, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/654,186

(22) Filed: May 3, 2024

(65) Prior Publication Data

US 2024/0282812 A1 Aug. 22, 2024

Related U.S. Application Data

(62) Division of application No. 17/536,391, filed on Nov. 29, 2021, now Pat. No. 11,984,475.

(51) Int. Cl.
*H10D 62/10* (2025.01)
*H10D 8/00* (2025.01)
*H10D 8/01* (2025.01)

(52) U.S. Cl.
CPC .............. *H10D 62/108* (2025.01); *H10D 8/00* (2025.01); *H10D 8/024* (2025.01)

(58) Field of Classification Search
CPC ........... H01L 29/0626; H01L 29/66113; H01L 29/861; H01L 21/76; H01L 27/0629; H01L 29/402; H01L 29/8611; H01L 29/0649; H01L 29/0692; H01L 29/404; H01L 29/66159; H01L 29/864; H01L 31/107; H01L 21/76202–76221; H01L 21/76235; H01L 2027/11833; H01L 21/76224–76237; H01L 21/823481; H01L 21/823878; H10D 62/108; H10D 8/024; H10D 8/411; H10D 8/043; H10D 8/00–825; H10D 64/111–117
See application file for complete search history.

(56) References Cited

U.S. PATENT DOCUMENTS

| | | | | |
|---|---|---|---|---|
| 7,859,009 | B1* | 12/2010 | Kerr | H01L 29/868 257/107 |
| 2016/0329106 | A1* | 11/2016 | Miwa | G11C 16/30 |
| 2019/0131389 | A1* | 5/2019 | Cai | H01L 21/761 |
| 2023/0126337 | A1* | 4/2023 | Kim | H01L 29/1095 257/438 |

\* cited by examiner

*Primary Examiner* — Shahed Ahmed

(74) *Attorney, Agent, or Firm* — Andrew R. Ralston; Frank D. Cimino

(57) ABSTRACT

An integrated circuit includes a shallow P-type well (SPW) below a surface of a semiconductor substrate and a shallow N-type well (SNW) below the surface. The SPW forms an anode of a diode and the SNW forms a cathode of the diode. The SNW is spaced apart from the SPW by a well space region; and a thin field relief oxide structure lies over the well space region.

18 Claims, 11 Drawing Sheets

HIGH VOLTAGE AVALANCHE DIODE FOR ACTIVE CLAMP DRIVERS

CROSS REFERENCE TO RELATED APPLICATIONS

This application is a divisional of application Ser. No. 17/536,391, issued as U.S. Pat. No. 11,984,475.

TECHNICAL FIELD

This disclosure relates to the field of semiconductor devices, and more particularly, but not exclusively, to diodes and methods of forming diodes with reduced sensitivity to impact ionization resulting from breakdown during reverse bias operation.

BACKGROUND

Reliable, high-voltage diodes, for use in sensing and clamping voltages, where the diodes must be able to withstand repeated breakdown voltages while providing little drift in capabilities over an extended period of time, can be difficult to provide in integrated circuits.

SUMMARY

Disclosed implementations provide an integrated circuit in which a shallow N-type well (SNW) and a shallow P-type well (SPW) are formed adjacent each other or with a well space region between the two shallow wells to form an SNW/SPW diode that may operate as an avalanche diode, with a thin field relief oxide structure over the PN junction between the SNW and the SPW. The thin field relief oxide structure isolates the SNW from the SPW at the surface of a substrate in which the wells are formed, and provides a greater distance, relative to analogous devices using shallow trench isolation (STI), from the oxide/substrate interface to a breakdown region between the wells. The greater distance may advantageously provide greater stability and reliability of an avalanche diode relative to an analogous STI-isolated diode. The oxide-isolated diode can therefore be used in lieu of a chain of low-voltage Zener diodes used in in some circuits such as a DC-DC ("buck") converter. Replacing the chain of Zener diodes with a single avalanche diode may simplify design of a circuit using the avalanche diode and may lower associated costs.

In one aspect, an implementation of an integrated circuit is disclosed. The integrated circuit includes an SPW adjacent to or spaced apart from an SNW in a semiconductor substrate. The SPW and SNW form a PN junction within the substrate. A thin field relief oxide structure covers the junction.

In another aspect, an implementation of a method of fabricating an integrated circuit is disclosed. The method includes forming a thin field relief oxide structure at a first surface of a substrate; forming an SNW in the substrate adjacent a first side of the oxide structure; and forming an SPW in the substrate adjacent an opposite second side of the oxide structure. The oxide structure covers a PN junction formed by the SPW and SNW within the substrate.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific implementations will now be described in detail with reference to the accompanying figures. In the following detailed description of implementations, numerous specific details are set forth in order to provide a more thorough understanding of the disclosure. However, it will be apparent to one of ordinary skill in the art that other implementations may be practiced without these specific details. In other instances, well-known features have not been described in detail to avoid unnecessarily complicating the description.

In laterally-diffused metal-oxide semiconductor (LD-MOS) technology, drivers for LDMOS power field effect transistors (FETs) employ various techniques, e.g., clamp circuits, which limit the excursion of the drain/source voltage Vds to keep the LDMOS power FET within its safe operating area. These techniques can increase the switching speed of the drain/source transition to improve efficiency, while also limiting the Vds excursion. Other uses for a clamping diode include use as a simple voltage reference and to absorb ringing energy. These clamp diodes must be able to survive repetitive breakdown stressing because the clamping action is provided by diode breakdown when reverse biased.

Some of the clamp circuits use Zener diodes for Vds voltage sensing, which have a breakdown voltage of about 5 V to 7 V. In order to use these Zener diodes for voltage sensing when the input supply is in the range of 12 V to 25 V, a stack of series-connected Zener diodes may be used. However, an elaborate circuit network may typically be used in conjunction with the stacked Zener diodes to block the DC voltage, which complicates sensing voltage variation. Response time may also be impacted by multiple diodes in series.

Figure 6:
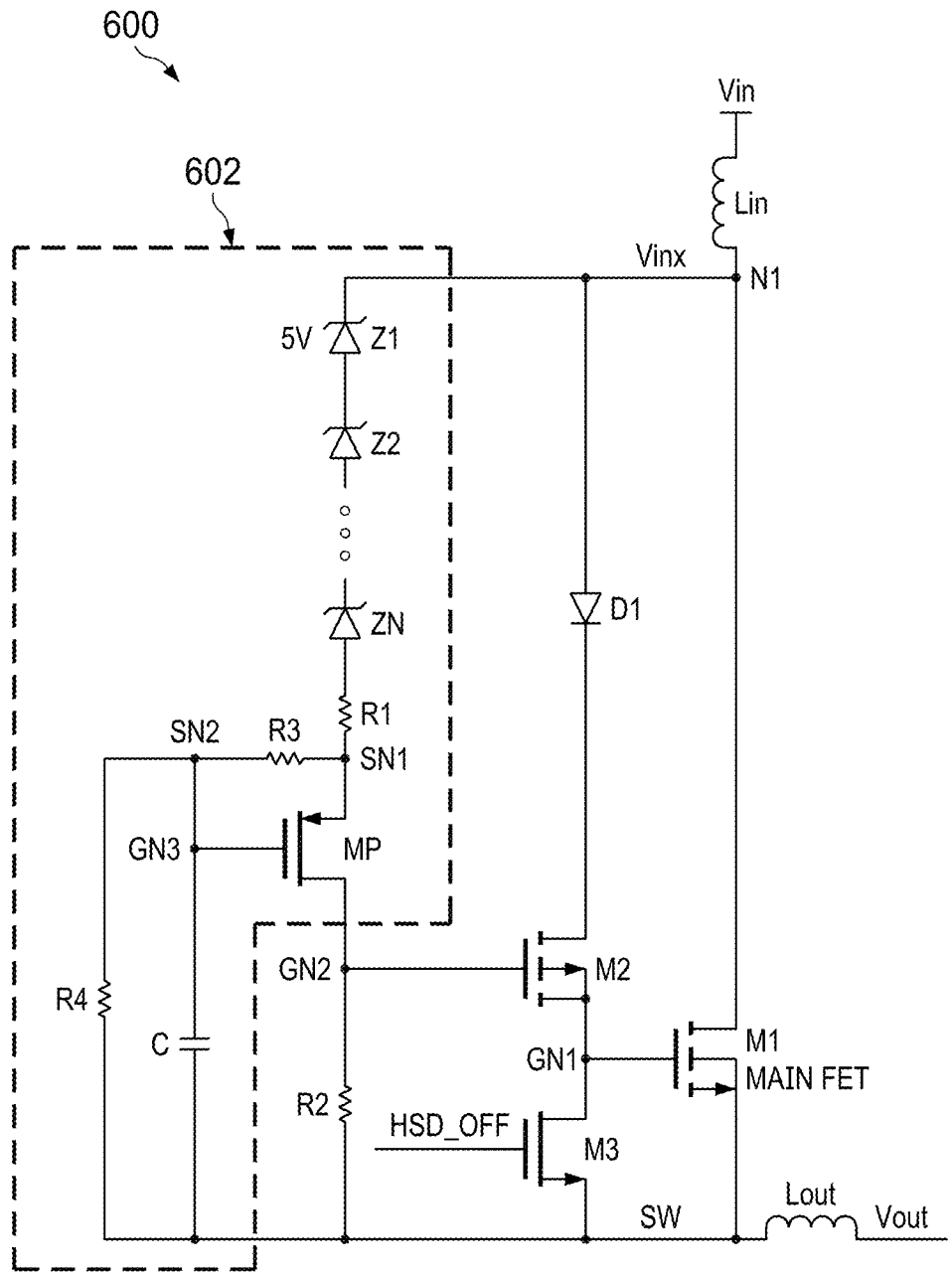
FIG. 6 depicts a circuit that uses series-coupled Zener diodes according to a baseline implementation.

FIG. 6 depicts an example baseline circuit 600 that may use a stacked series of Zener diodes Z1 through ZN to sense and clamp the voltage across a first power N-type FET (NFET) M1, which may be a high-side power NFET in a DC-DC converter. The first power NFET M1 is coupled in series with an output inductor Lout between an input node Vin, which may be coupled to an input power supply, and an output node Vout, which may be coupled to provide an output power supply. A parasitic inductor Lin, which may be formed, e.g., by the package lead frame, bond wire, etc., is also shown between the input node Vin and the first power NFET M1. In this example implementation, a number of Zener diodes Z1 through ZN are coupled in series with a first resistor R1, a P-type FET (PFET) MP, and a second resistor R2 between a first node N1 and a switch node SW. The first node N1 lies between the input node Vin and the first power NFET M1 and the switch node SW lies between the first power NFET M1 and the output inductor Lout. A signal diode D1 is also coupled in series with a second power NFET M2 and a pull-down NFET M3 between the first node N1 and the switch node SW. A gate of the first power NFET M1 is coupled to a first gate node GN1, which lies between the second power NFET M2 and the pull-down NFET M3, while a gate of the second power NFET M2 is coupled to a second gate node GN2, which lies between the PFET MP and the second resistor R2. A gate of the pull-down NFET M3 is coupled to receive a high-side driver off signal HSD_OFF.

The series of Zener diodes Z1 through ZN, the first resistor R1, and the PFET MP are part of a sensing circuit 602, which also includes a third resistor R3, a fourth resistor R4, and a capacitor C. The third resistor R3 and the fourth resistor R4 are coupled in series between a first sense node SN1 and the switch node SW. The first sense node SN1 lies between the first resistor R1 and the PFET MP. The capacitor C has a first terminal coupled to a second sense node SN2, which lies between the third resistor and the fourth resistor R4; a second terminal of the capacitor C is coupled to the switch node SW. A gate of the PFET MP is coupled to a third gate node GN3 that is located between the second sense node SN2 and capacitor C. The sensing circuit 602 may be designed to begin pulling up the second power NFET M2 when the series of Zener diodes Z1-ZN starts to conduct a current, indicating that the voltage across the first power NFET M1 is approaching a breakdown point. The series of Zener diodes Z1-ZN may be designed to go into breakdown at a voltage that is, e.g., about 2-3 V less than a breakdown voltage for the first power NFET M1. Much of the complexity of the sensing circuit 602 is due to the necessity of using a stack of Zener diodes, rather than a single diode.

An alternative to using a Zener diode may be an avalanche diode formed as a lateral SNW/SPW diode. Such SNW/SPW diodes, which are used to trigger electrostatic discharge bipolar junction transistors, can operate at voltages between about 12 V and about 35 V. However, lateral SNW/SPW diodes are currently fabricated using STI over the SNW/SPW junction. As used herein, "STI" refers to oxide isolation structures formed in trenches in a semiconductor substrate and extending at least 150 nm below the surface of the substrate. The inventors have discovered that for such diodes using STI between SNW and SPW, the proximity of the breakdown depth to an overlying STI oxide in the SNW/SPW diode may produce a reduction in lifetime stability when subjected to repeated breakdown stressing. Further, the lifetime stability of the SNW/SPW diode may be improved by increasing a distance between an isolation structure and the breakdown depth.

Figure 7:
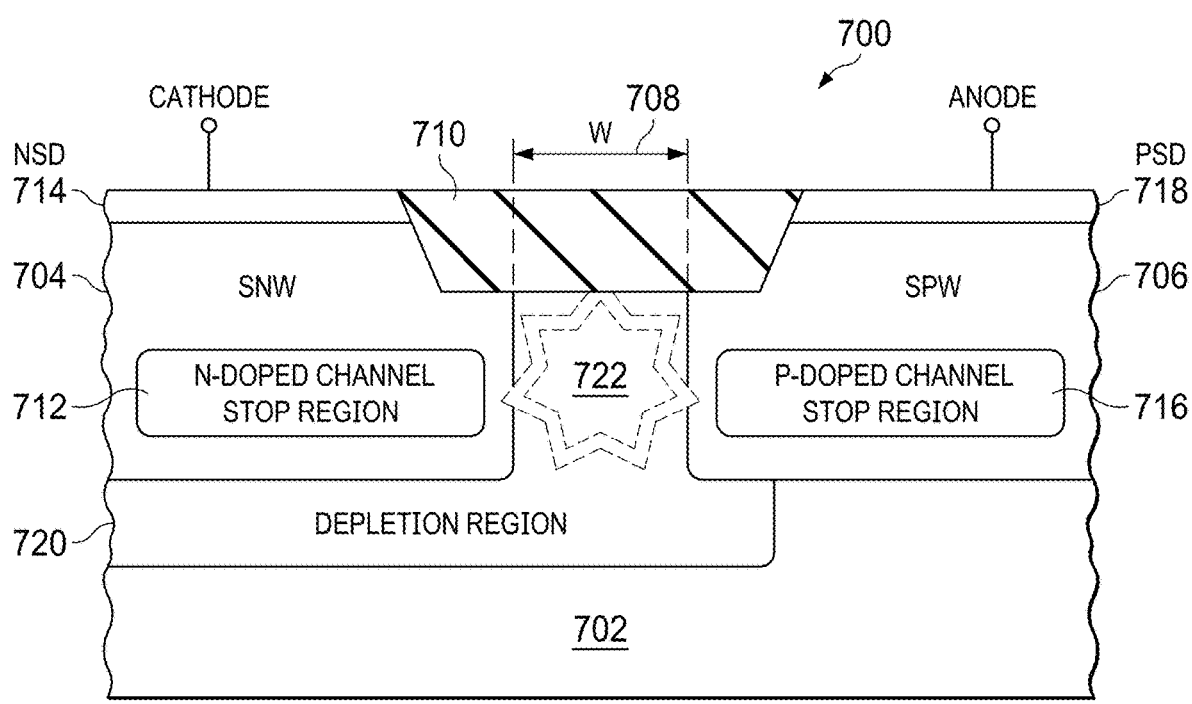
FIG. 7 illustrates a cross-section of an avalanche diode that uses STI over the well space region and a location in which an impact ionization region would form according to a baseline implementation.

FIG. 7 depicts a cross-section of a baseline SNW/SPW diode 700, also known as an avalanche diode 700. Avalanche diodes differs from Zener diodes in that the avalanche diode has a lighter level of doping than does the Zener diode and can be designed to have a higher breakdown voltage. The avalanche diode 700 includes a substrate 702, which may be, e.g., a P-type bulk silicon wafer and/or a P-type epitaxial layer. N-type dopants have been implanted into a surface of the substrate 702 to form an SNW 704; similarly, P-type dopants have been implanted into the surface of the substrate 702 to form an SPW 706. The SNW 704 and the SPW 706 are separated by a well space region 708 that has a width W; an STI structure 710 has been formed over the well space region.

Multiple implants may be used to form each of the SNW 704 and the SPW 706, with the heaviest doping within each shallow well forming a channel-stop region in a lower portion of the shallow well. In the avalanche diode 700, the SNW 704 includes an N-doped channel-stop region 712, and an NSD region 714 is located between the SNW 704 and the surface of the substrate 702 to connect to the SNW 704. The SPW 706 includes a P-doped channel-stop region 716, and a PSD region 718 is located between the SPW 706 and the surface of the substrate 702 to connect to the SPW 706. A depletion region 720 forms around the SNW 704.

An impact ionization region 722 identifies a portion of the depletion region 720 at which breakdown of the avalanche diode 700 may occur during reverse-bias operation. The STI structure 710 may extend into the substrate 702 by about 300 nm to about 400 nm. This depth places the interface between the STI structure 710 relatively close to the impact ionization region 722. Over time and repeated occurrences of breakdown, high-energy "hot" carriers may cause trapped charge centers at the interface and in the oxide that forms the STI structure 710. The trapped charges may cause a shift in the parameters of the avalanche diode 700 that can affect the operation of an integrated circuit, e.g., the baseline circuit 600, and may contribute to early failure of the integrated circuit. Accordingly, while the avalanche diode 700 may be advantageous for a higher breakdown voltage in some applications, reliability concerns have limited the use of the avalanche diode 700.

The breakdown voltage of an avalanche diode, e.g., avalanche diode 700, may be varied by two methods, including altering the doping levels of the SNW 704 and the SPW 706 and changing the width W of the well space region 708 between the SNW 704 and the SPW 706. This ability to adjust the breakdown voltage by adjusting the width of the well space region 708 may provide a simple method for incorporating an SNW/SPW diode into an IC, with the resulting breakdown voltage determined simply by adjusting the well space region 708 if the reliability issue can be addressed.

Figure 1:
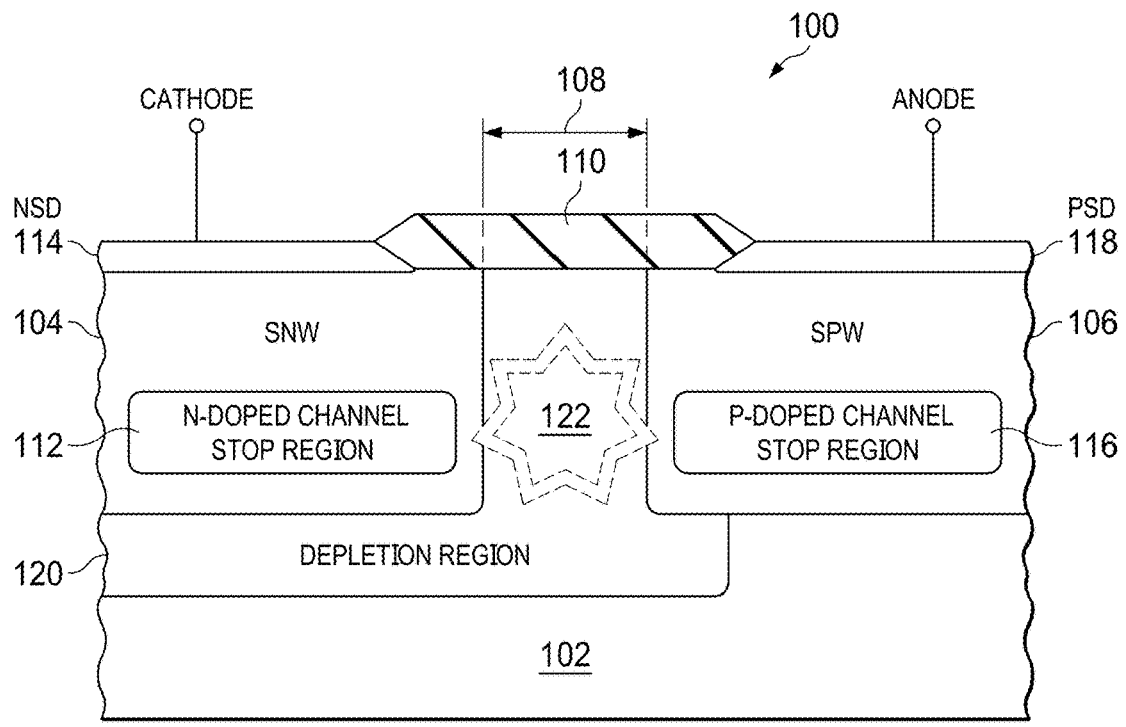
FIG. 1 illustrates a cross-section of an SNW/SPW diode that is an avalanche diode and a location in which an impact ionization region would form according to an implementation of the disclosure.

FIG. 1 depicts a cross-section of an SNW/SPW diode 100, also known as an avalanche diode 100, which is expected to offer increased reliability at higher voltages than previously possible. The avalanche diode 100 contains a substrate 102 that is p-type in the current example, an SNW 104, an SPW 106 and a thin field relief oxide structure 110 that lies over the well space region 108 between the SNW 104 and the SPW 106, shown in the current example as a thin local oxidation of silicon (LOCOS) structure. The substrate 102, e.g. a lightly-doped p-type epitaxial layer, extends between the SNW 104 and the SPW 106 between, toward and possibly to the field relief oxide structure 110. The SNW 104 may have a depth of about 1.5 μm, and contains an N-doped channel-stop region 112. A heavily doped NSD region 114 is located between the SNW 114 and the surface of the substrate 102 to provide a contact region to the SNW 114. The SPW 106 contains a P-doped channel-stop region 116, and a heavily doped PSD region 118 is located between the SPW 106 and the surface that provides a contact region to the SPW 106. The depth of the SPW 106 is typically indeterminant as the SPW 106 merges with the p-type substrate 102.

Herein and in the claims, the term "thin field relief oxide" refers to one or both of two characteristics of the field relief oxide structure 110. In a first example an oxide structure formed at or in the surface of a semiconductor substrate is characterized as having a thickness no greater than about 200 nm, or a recess depth below a surface of the substrate no greater than about 100 nm or in some examples 50 nm or less. In a second example the oxide structure formed at or in the surface of the semiconductor substrate is characterized as having a thickness no greater than one-half the thickness of an STI structure that surrounds the thin field relief oxide structure. In another example the oxide structure formed at or in the surface of the semiconductor substrate is characterized by extending below a top surface of the semiconductor surface no more than about 30% of an STI structure formed elsewhere on the substrate, such as to isolate the diode from other circuits on the substrate. In some cases the extent to which the oxide structure extends below the substrate surface may even smaller than 30% of an STI structure in the device, e.g. 10% or less, or even nearly zero.

The thin field relief oxide 110 may be implemented in one of several manners. In a first example, the thin field relief oxide 110 is implemented as a LOCOS structure that may extend above and below an original plane of the substrate 102 by no more than about 100 nm. In another example, the thin field relief oxide 110 may be a "step gate" oxide structure. A step gate oxide may be formed by, e.g. performing a first thick gate oxidation, performing a masked etch of the thick oxide to remove most of the oxide over the substrate surface and leaving a remaining thick portion, and then performing a gate oxidation to produce a thin oxide. The step gate oxide may have a negligible recess depth. In a third example the thin field relief oxide may be implemented by a process similar to an STI process, but limited to a recess depth no greater than about 100 nm. In this context, "about 100 nm" means 90-110 nm.

In some examples the N-doped channel-stop region 112 may be formed to a depth of about 1.5 μm with a peak dopant concentration at about 0.5 μm to about 0.6 μm below the substrate 102 surface. In such examples the P-doped channel-stop region 116 may be formed with a peak dopant concentration at about 0.7 μm below the substrate 102 surface. Without implied limitation these depths may be commensurate with the use of STI over the well space region 108, e.g. as exemplified by the baseline diode 700. The presence of the N-type doping in the SNW 104 causes a depletion region 120 to form around the SNW 104 extending into the substrate 102. The thin field relief oxide structure 110 may have a thickness in the range between about 50 nm and about 150 nm. In another aspect the thin field relief oxide structure 110 may extend below the substrate surface by about 15-30 nm. Thus in various examples the SNW 104 peak doping, e.g. in the channel stop region 112, may be about 450 nm to 685 nm below the thin field relief oxide structure 110. Similarly, the SPW 106 peak doping, e.g. in the channel stop region 116, may be about 670 nm to 685 nm below the thin field relief oxide structure 110.

As can be seen in avalanche diode 100, the thin field relief oxide structure 110 does not extend downward into the SNW 104 or the SPW 106 as deeply as does the STI structure 710 (FIG. 7). The combination of fabricating the SNW 104 and the SPW 106 using implant processes similar to the implant processes of the SNW 704 (FIG. 7) and the SPW 706 (FIG. 7), which are fabricated to work with the STI structure 710 (FIG. 7), and fabricating the thin field relief oxide structure 110 may provide several advantages. Although an impact ionization region 122 generally occurs at a similar depth with regard to the SNW 104 and the SPW 106, a greater distance now exists between the thin field relief oxide structure 110 and the impact ionization region 122. This increased distance reduces opportunities for injections of "hot" carrier charges into the oxide of the thin field relief oxide structure 110. Additionally, LOCOS structures are naturally more rounded than STI structures and do not have the sharper corners of the STI structures. The more rounded shape may also contribute to fewer hot carriers being injected into the oxide of the LOCOS structures. This is expected to provide an avalanche diode that may be more predictable and more stable over a longer period of time relative to the baseline example diode 700.

Figure 1A:
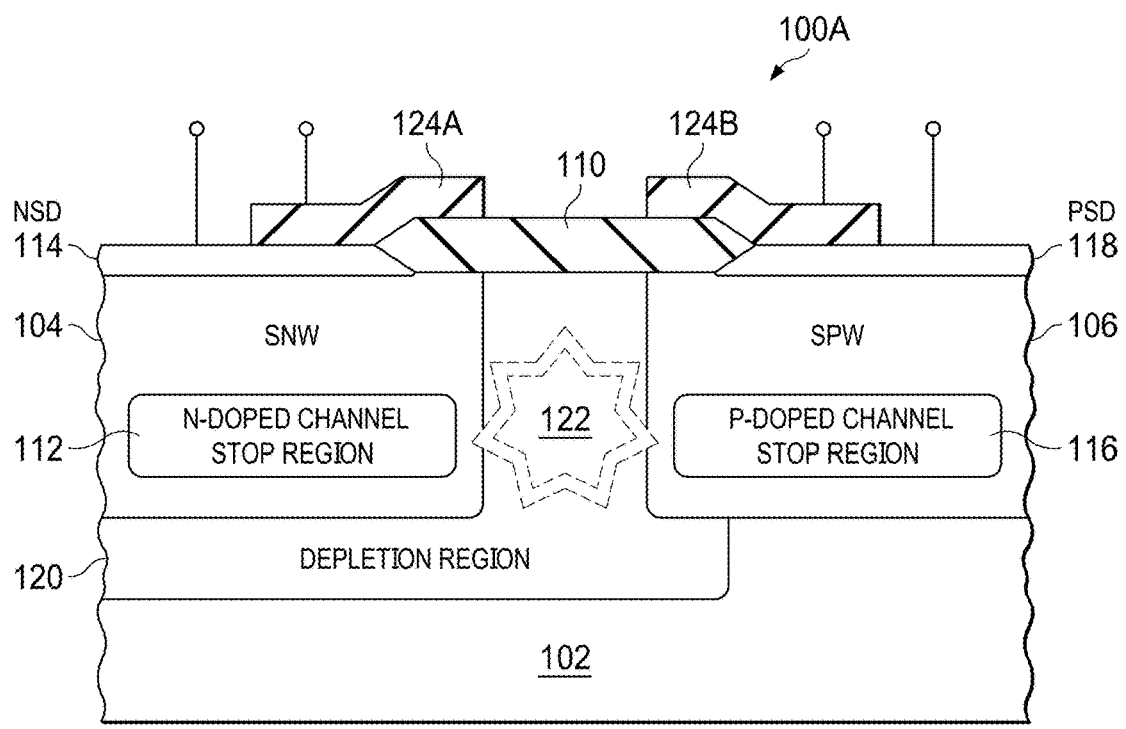
FIG. 1A illustrates a cross-section of an avalanche diode and a location in which an impact ionization region would form according to an implementation of the disclosure.

FIG. 1A depicts an avalanche diode 100A that includes all the elements of the avalanche diode 100 and also includes a first polysilicon field plate 124A and a second polysilicon field plate 124B, which in one implementation may be formed using a layer of polysilicon that may also be used to form the gates of FETs formed elsewhere on the same substrate 102. A gate dielectric, not shown, may space the field plates 124A, 124B away from the surface of the substrate 102. The first polysilicon field plate 124A lies partially over a first side of the thin field relief oxide structure 110 and partially over the NSD region 114 of the SNW 104. Similarly, the second polysilicon field plate 124B lies partially over a second, opposite side of the thin field relief oxide structure 110 and partially over the PSD region 118 of the SPW 106. Thus, the first polysilicon field plate 124A is capacitively coupled to the SNW 104 and the second polysilicon field plate 124B is capacitively coupled to the SPW 106; together, the two polysilicon field plates may help to keep the electric potential lines from creating a high field at the surface and may help drive the electrical activity, including portions of the impact ionization region 122, deeper into the SNW 104 and the SPW 106.

Figure 2A:
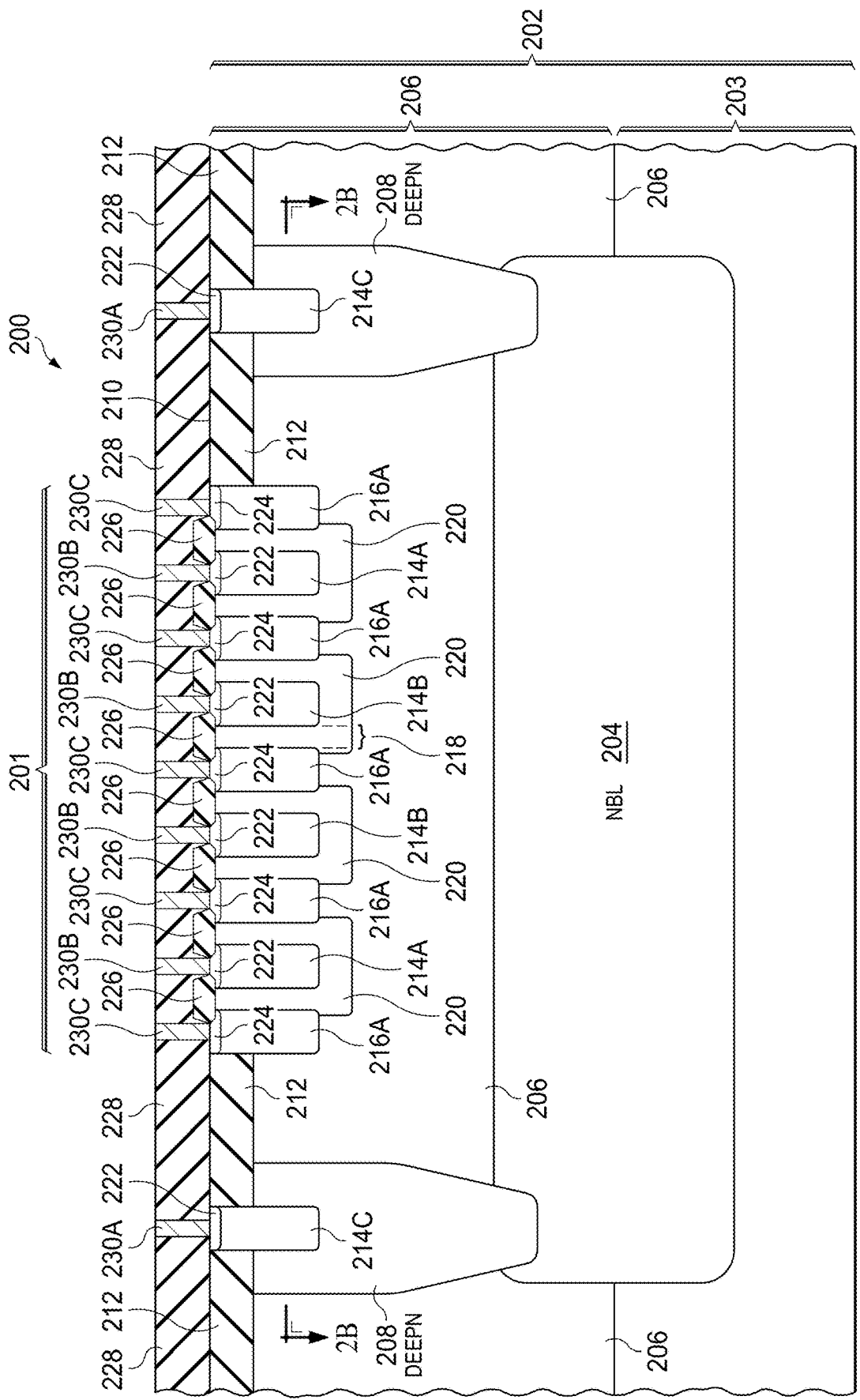
FIG. 2A depicts a cross-section of an avalanche diode and an isolation structure surrounding the SNW/SPW diode according to an implementation of the disclosure.
Figure 2B:
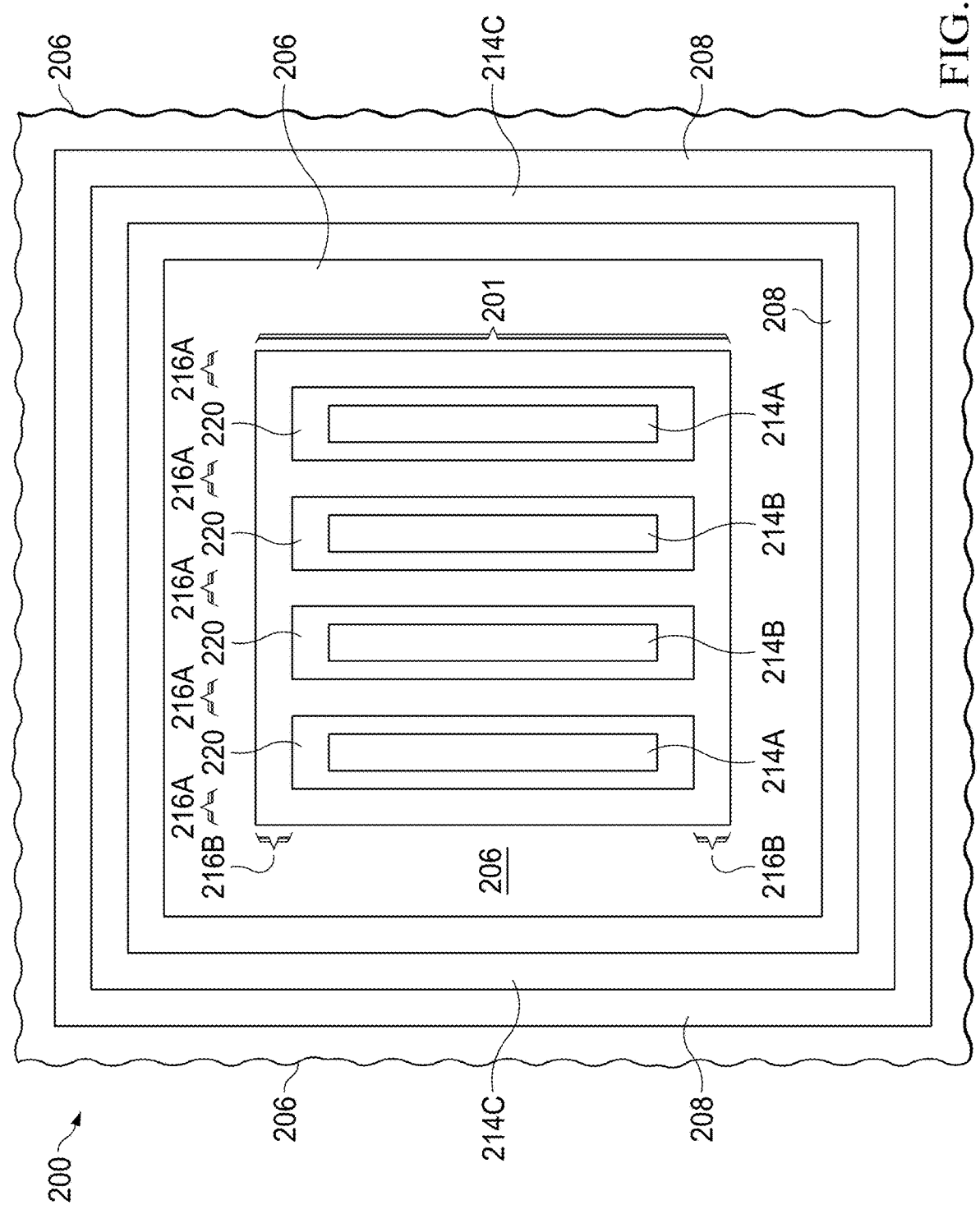
FIG. 2B depicts an overhead view of the avalanche diode and the associated isolation structure taken at the line 2B-2B.

FIG. 2A depicts a cross-section of an integrated circuit (IC) 200 containing an avalanche diode 201 and an isolation structure that may surround the avalanche diode 201 in some implementations of the disclosure. FIG. 2B depicts a plan view of the IC 200, which includes the avalanche diode 201 and the isolation structure, taken through the line 2B-2B in FIG. 2A in an example implementation of the disclosure. A substrate 202, which in this implementation may be P-type, may include a bulk silicon layer 203 and an epitaxial layer 206 formed over the bulk silicon layer 203. An N-type buried layer (NBL) 204 has been formed in the substrate 202. A deep N-type (DEEPN) diffusion region 208 has been implanted and extends from an upper surface 210 of the substrate 202 to the NBL 204 around the circumference of the NBL 204 to form, together with the NBL 204, an isolation structure. In FIG. 2B, the DEEPN diffusion region 208 is seen surrounding a portion of the epitaxial layer 206 and the avalanche diode 201.

STI structures 212 can be formed at portions of the upper surface 210 of the IC 200, both outside the DEEPN diffusion region 208 and also between the avalanche diode 201 and the DEEPN diffusion region 208. The STI structures 212 may surround the diode 201, providing isolation from other devices on the substrate 202. Within the isolation structure formed by the DEEPN diffusion region 208 and the NBL 204, the avalanche diode 201 may be formed of alternating SNW fingers 214 and SPW fingers 216, which are each separated from adjacent shallow well fingers of an opposite conductivity type by a well space region 218 that may be designed with a first width between 0 µm and 1.3 µm to achieve a breakdown voltage between about 12 V and about 35 V. The first width may also be greater than 1.3 µm if higher breakdown voltages are desired. Because of this simple adjustment to the well space region 218 to adjust the breakdown voltage of the avalanche diode 201, integration of the avalanche diode 201 into a circuit may be greatly simplified.

The "fingers" are more clearly shown in FIG. 2B, in a view looking down from the line 2B-2B. In FIG. 2A and FIG. 2B, the SNW fingers 214 may be logically separated into three groups according to location: outermost SNW fingers 214A are near an outside edge of the avalanche diode 201, inner SNW fingers 214B are the remaining fingers in the avalanche diode 201, and tank SNW fingers 214C are formed in the DEEPN diffusion region. As shown in the current example, the tank SNW fingers 214C may completely surround the diode 201. The SNW fingers 214A, 214B and 214C may be collectively referred to as SNW finger 214. Similarly, the SPW fingers 216 may be logically divided into two groups: first SPW fingers 216A are seen in FIG. 2A and extend parallel to the SNW fingers and second SPW fingers 216B extend perpendicularly to the first SPW fingers along the surface of the substrate 202 and are seen in FIG. 2B, where a combination of the first SPW fingers 216A and the second SPW fingers 216B surrounds each of the SNW fingers 214A, 214B within the avalanche diode 201 on four sides. Reference to the SPW fingers 216 refer to these fingers collectively. A depletion region 220 forms around the respective SNW fingers 214A, 214B in the avalanche diode 201. Referring to FIG. 2A, each SNW finger 214 includes an NSD region 222 and each SPW finger 216 includes a PSD region 224. A field relief oxide provided by a thin LOCOS structure 226 lies over the well space region 218 between each pair of an SNW finger 214 and a SPW finger 216. Although the thin LOCOS structure 226 is not explicitly shown in FIG. 2B, the upper surface 210 over the well space region 218 between each of the SNW fingers 214A, 214B in the avalanche diode 201 and the SPW fingers 216 are covered by the thin LOCOS structure 226. The tank SNW fingers 214C and the respective NSD region 222 are also formed in the DEEPN diffusion region 208.

Finally, an interconnect dielectric 228 (FIG. 2A) lies over the upper surface 210 of the IC 200 and the avalanche diode 201. Vias 230 are formed through the interconnect dielectric 228 to each of the contact regions. A first set of vias 230A are coupled to the NSD regions 222 that connect to the DEEPN diffusion region 208. A second set of vias 230B are coupled to the NSD regions 222 within the avalanche diode 201 to provide electrical connections to the cathode and a third set of vias 230C are coupled to the PSD regions 224 within the avalanche diode 201 to provide electrical connections to the anode. Exceptions to the connections for the second set of vias 230B are discussed below.

The electrical connections to the isolation structure through the first set of vias 230A can depend on the implementation in which the avalanche diode 201 is provided. When used with a driving circuit for a high-side power FET, as in some examples provided herein, the isolation structure may be coupled to the cathode. In some other implementations, the isolation structure may be coupled to the anode. Other implementations may leave the isolation structure floating or couple the isolation structure to a separate power node that may be available on the IC to provide a voltage during operation. In one example implementation in which the avalanche diode 201 is used in a driving circuit for a low-side power FET, the avalanche diode 201 may be used without an isolation structure. Although only four SNW fingers 214 and the surrounding SPW fingers 216 are shown forming avalanche diode 201, additional inner SNW fingers 214B and first SPW fingers 216A may be formed.

An issue that can be important to consider in avalanche diode 201 is known as the first finger effect. In semiconductor processing, the first finger effect recognizes that in forming fingers such as seen in FIG. 2B, the known processes are not perfect, and when damage occurs, the damage may be worse on the outermost fingers. In the avalanche diode 201, the fingers of most concern are the outermost SNW fingers 214A, which are tied to a high voltage node, rather than any of the first SPW fingers 216A, which are tied to a ground node. The issue may be managed by one of several methods, primarily by making the outermost SNW fingers 214A into dummy fingers, which are not tied to the inner SNW fingers 214B, or by leaving the outermost SNW fingers 214A as active fingers, but spacing them farther from the adjoining first SPW fingers 216A.

When the outermost SNW fingers 214A include dummy fingers, the outermost SNW fingers 214A may be tied to the anode, although the connection to the ground node may cause leakage. Alternately, the outermost SNW fingers 214A may have a separate connection tied to a DC bias node (not shown) that may be available to provide a DC bias voltage during operation or may be left floating.

When the outermost SNW fingers 214A are active, the designer may provide additional spacing between the outermost SNW fingers 214A and the surrounding first SPW fingers 216A, e.g., the outermost SNW fingers 214A are separated from the surrounding first SPW fingers 216A by a second width that is greater than the first width. This additional spacing causes the outermost SNW fingers 214A to breakdown at a higher voltage than the inner SNW fingers 214B and thus only breakdown after the inner SNW fingers 214B have reached breakdown, minimizing any effect the outermost SNW fingers 214A may have on the overall breakdown of avalanche diode 201.

The use of thin LOCOS structures or similar thin field relief oxide structures instead of STI structures over the well space region 218 between the SNW fingers 214 and SPW fingers 216 may influence several parameters that can be important for the avalanche diode 201. A simulated comparison was made of an SNW/SPW diode formed using an STI structure over the well space region versus a similar SNW/SPW diode formed using a thin LOCOS structure over the well space region. For each diode structure, the cathode current density was simulated across a range of increasing cathode voltages, using a number of well space regions that ranged between about 0.0 μm and about 1.0 μm. For each in well space region, the current density rose more quickly for diodes with a LOCOS structure over the well space region, and therefore achieved a higher cathode current density at a lower cathode voltage. This ability to carry a larger current may allow a smaller diode to be used in a given circuit. Given the large currents, e.g. in the tens of milliamps, that the avalanche diode 201 may need to carry, the ability to fabricate the avalanche diodes 201 in a smaller area may be an important benefit.

A reliability analysis was also performed to compare SNW/SPW diodes formed using an STI structure over the well space region with SNW/SPW diodes formed using a thin LOCOS structure over the well space region. The analysis predicted that over a ten year period, the breakdown voltage on an SNW/SPW diode formed using an STI structure would change by about 600 mV, while an SNW/SPW diode formed using a LOCOS structure would change by only about 400 mV. This increased reliability can be attributed to the increased distance between the location of the breakdown and the LOCOS structure, which reduces the hot carrier charge injection into the overlying oxide.

Figure 3A:
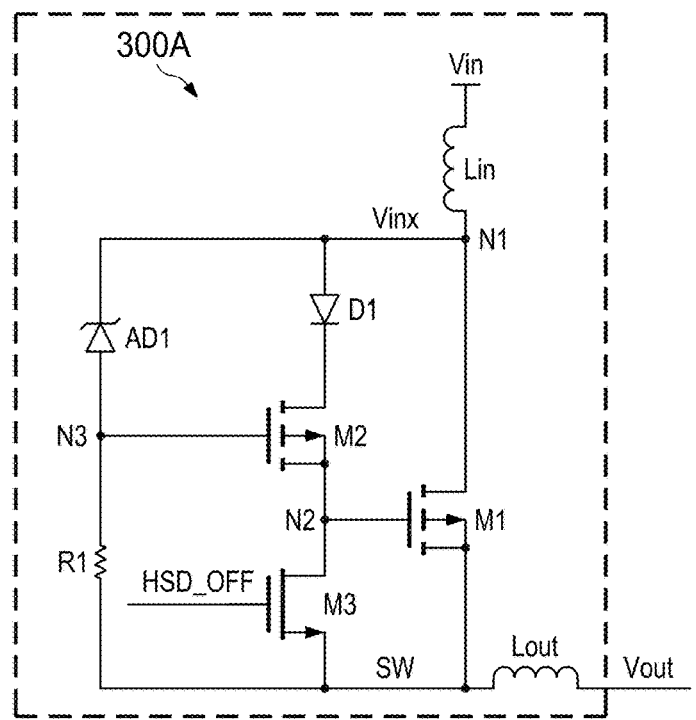
FIG. 3A depicts a circuit in which the disclosed avalanche diode can be used according to an implementation of the disclosure.

FIG. 3A depicts a circuit 300A, which can be used in lieu of the circuit 600 (FIG. 6) and which uses an avalanche diode AD1, such as the avalanche diode 100 (FIG. 1), the avalanche diode 100A (FIG. 1A), or the avalanche diode 201 (FIG. 2A), which may have a breakdown voltage in the range of about 12 V to about 25 V. The circuit 300A again includes a first power NFET M1 coupled in series with an output inductor Lout between an input node Vin, which may be coupled to an input power supply, and an output node Vout, which may be coupled to provide an output power supply; the parasitic inductor Lin is also shown. Rather than using a number of Zener diodes, as was used in circuit 600, an avalanche diode AD1 is coupled in series with a first resistor R1 between a first node N1 and a switch node SW. More specifically, the avalanche diode AD1 has a cathode coupled to the first node N1 and an anode coupled to the first resistor R1 and is reverse biased during operation of the circuit 300A. The first node N1 lies between the input node Vin and the first power NFET M1 and may have an input inductor voltage Vinx; the switch node SW lies between the first power NFET M1 and the output inductor Lout. Additionally, a signal diode D1 is coupled in series with a second power NFET M2 and a pull-down NFET M3 between the first node N1 and the switch node SW. A gate of the first power NFET M1 is coupled to a second node N2 between the second power NFET M2 and the pull-down NFET M3, while a gate of the second power NFET M2 is coupled to a third node N3 between the avalanche diode AD1 and the first resistor R1. A gate of the pull-down NFET M3 is coupled to receive a high-side driver off signal HSD_OFF. In the circuit 300A, the more complicated sensing sub-circuit 702 of FIG. 7 is replaced by the single avalanche diode AD1. The use of avalanche diode AD1 may simplify the design of new circuits that need the higher voltage-sensing capabilities and may also provide improved reliability to the circuit. In this configuration, the drain/source voltage of the first power NFET M1 ($V_{DSM}1$) is equal to the sum of the voltage across the avalanche diode AD1 ($V_{AD}1$), the gate/source voltage of second power NFET M2 ($V_{GSM}2$), and the gate/source voltage of first power NFET M1 ($V_{GSM}1$). The breakdown voltage of the avalanche diode AD1 in reverse bias can be selected to be reached before a destructive breakdown voltage on the first power NFET M1 can be reached.

When the first power NFET M1 is turned on, the voltage across the first power NFET M1 is low and does not pose a problem. When the first power NFET M1 is turned off, a high-side driver off signal HSD_OFF turns the pull-down NFET M3 on to help pull the gate of the first power NFET M1 low and the drain/source voltage across the first power NFET M1 increases as the parasitic inductor Lin continues to drive current into the circuit 300A. The voltage across the avalanche diode AD1 also increases. During the design of the circuit 300A, the reverse bias breakdown voltage of the avalanche diode AD1 has been chosen to reach an associated breakdown voltage before the voltage across first power NFET M1 reaches a destructive breakdown voltage. When the avalanche diode AD1 reaches breakdown, a current is provided to the gate of second power NFET M2 that will start to turn on the second power NFET M2 and may cause the first power NFET M1 to begin turning on. Once the input inductor voltage Vinx drops below a critical value, avalanche diode AD1 is no longer in breakdown and will not provide a current, so that the second power NFET M2 will turn off. The first power NFET M1 may be controlled by additional circuitry (not shown) until the next time that the first power NFET M1 is designed to turn off.

Figure 3B:
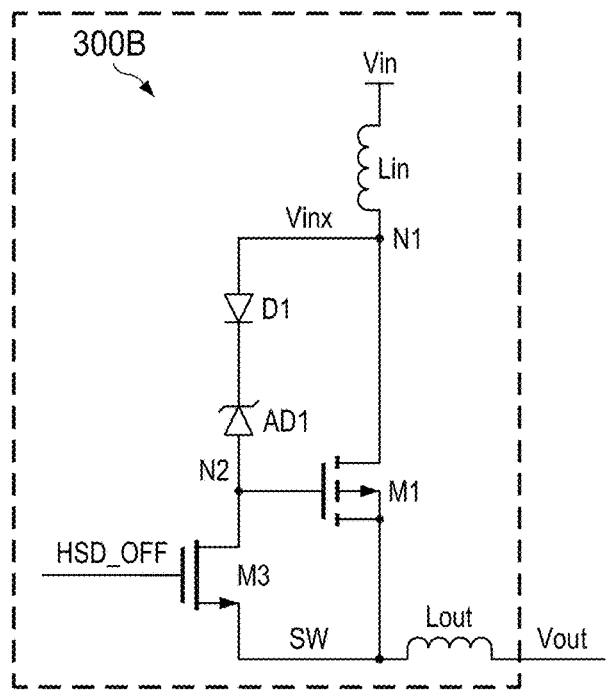
FIG. 3B depicts a circuit in which the disclosed avalanche diode can be used according to an implementation of the disclosure.

FIG. 3B provides a circuit 300B for sensing the voltage across first power NFET M1 that is even simpler than circuit 300A (FIG. 3A). The circuit 300B also includes a first power NFET M1 coupled in series with an output inductor Lout between an input node Vin, which can be coupled to an input power supply, and an output node Vout, which may be coupled to provide an output power supply. A signal diode D1 is coupled in series with an avalanche diode AD1 and a pull-down NFET M3 between a first node and a switch node. The first node is between the input node Vin and the first power NFET M1 and the switch node SW lies between the first power NFET M1 and the output inductor Lout. A gate of the pull-down NFET M3 is coupled to receive a high-side driver off signal HSD_off so that the pull-down NFET M3 can help turn off the first power NFET M1. A gate of the first power NFET M1 is coupled to a second node N2, which lies between the avalanche diode AD1 and the pull-down NFET M3. In the circuit 300B, when the input inductor voltage Vinx increases beyond a breakdown voltage of the avalanche diode AD1, the current through the avalanche diode and the pull-down NFET M3 relieves the excess voltage. Additionally, if the current through the avalanche diode AD1 is greater than the current through the pull-down NFET M3, the voltage on the gate of the first power NFET M1 increases and will begin to turn on the first power NFET M1, allowing additional current to flow and the input inductor voltage Vinx to decrease. One additional advantage of the SNW/SPW diode 201 that hasn't been mentioned previously may be a somewhat greater parasitic capacitance than is found in a stack of Zener diodes, which in applications exemplified by circuit 300A and circuit 300B will help to engage the clamp during the rise in the Vds of the first power NFET M1 and may help to mitigate sharp peak ringing. An important takeaway from the disclosed circuits is simply that the single avalanche diode AD1 can be coupled in parallel with a power FET having a voltage up to about 35 V to provide protection from overvoltage; the application does not have to be in combination with a high-side power NFET.

FIG. 4A through 4D depicts an IC 400 in various stages of fabrication of an avalanche diode 401, herein also referred to as an SNW/SPW diode 401 and an associated isolation tank 409. Stages of fabrication of the SNW/SPW diode 401 and the isolation tank 409 prior to FIG. 4A may be performed by novel or conventional processes. Some examples of such conventional processes may be found in U.S. Pat. No. 6,617,217 to Mahalingam Nandakumar et al. (hereinafter the '217 patent) and U.S. Pat. No. 6,967,380 to Matthew J. Breitwisch et al. (hereinafter the '380 patent), which are hereby incorporated by reference in their entirety. One skilled in art can determine appropriate implant conditions for a particular device design in view of the incorporated subject matter.

Figure 4A:
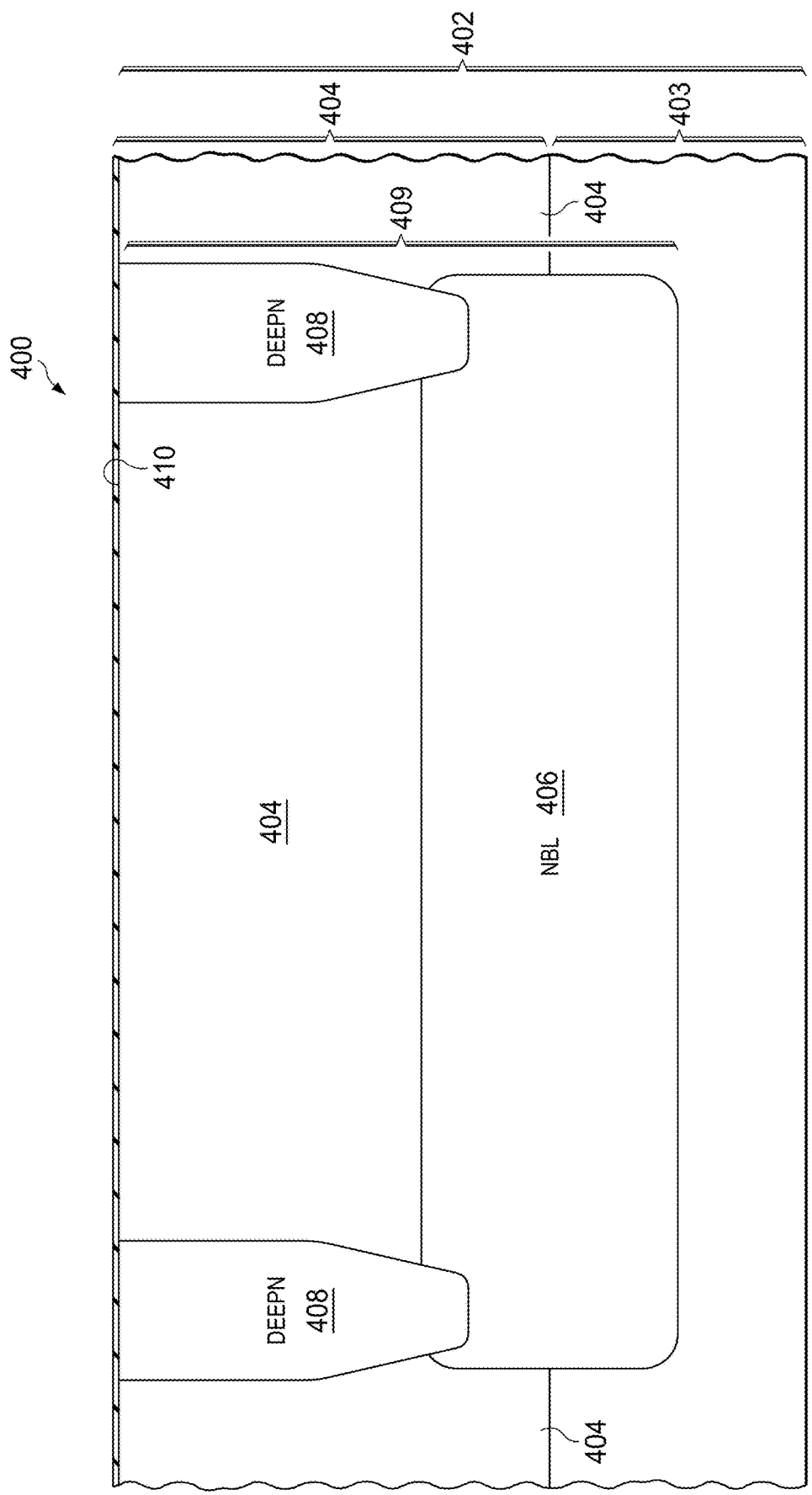
FIG. 4A through FIG. 4D depict different stages during the fabrication of an IC containing an avalanche diode according to an implementation of the present disclosure.

FIG. 4A depicts an IC 400 after fabrication of an isolation tank 409. The IC 400 includes a substrate 402, which in the current implementation may be P-type, and an NBL 406. The substrate 402 may include a bulk silicon layer 403 and an epitaxial layer 404 formed over the bulk silicon layer 403. In an example implementation, an N-type dopant (not shown) was implanted through a first patterned mask (not shown) in the surface of the bulk silicon layer 403 prior to forming the epitaxial layer 404. As the epitaxial layer 404 was grown or deposited, the implanted N-type dopant, which may be arsenic, diffused into both the bulk silicon layer 403 and the epitaxial layer 404 to form the NBL 406. A DEEPN diffusion region 408 may be formed around the perimeter of the NBL 406 by deep implantation through a second patterned mask (not shown) of an N-type dopant such as phosphorous. The substrate 402 is annealed to complete formation of the DEEPN diffusion region 408. Together, the NBL 406 and the DEEPN diffusion region 408 form an isolation tank 409. In some implementations, the isolation tank 409 is not needed; in these implementations, formation of the isolation tank 409 may be omitted.

Figure 4B:
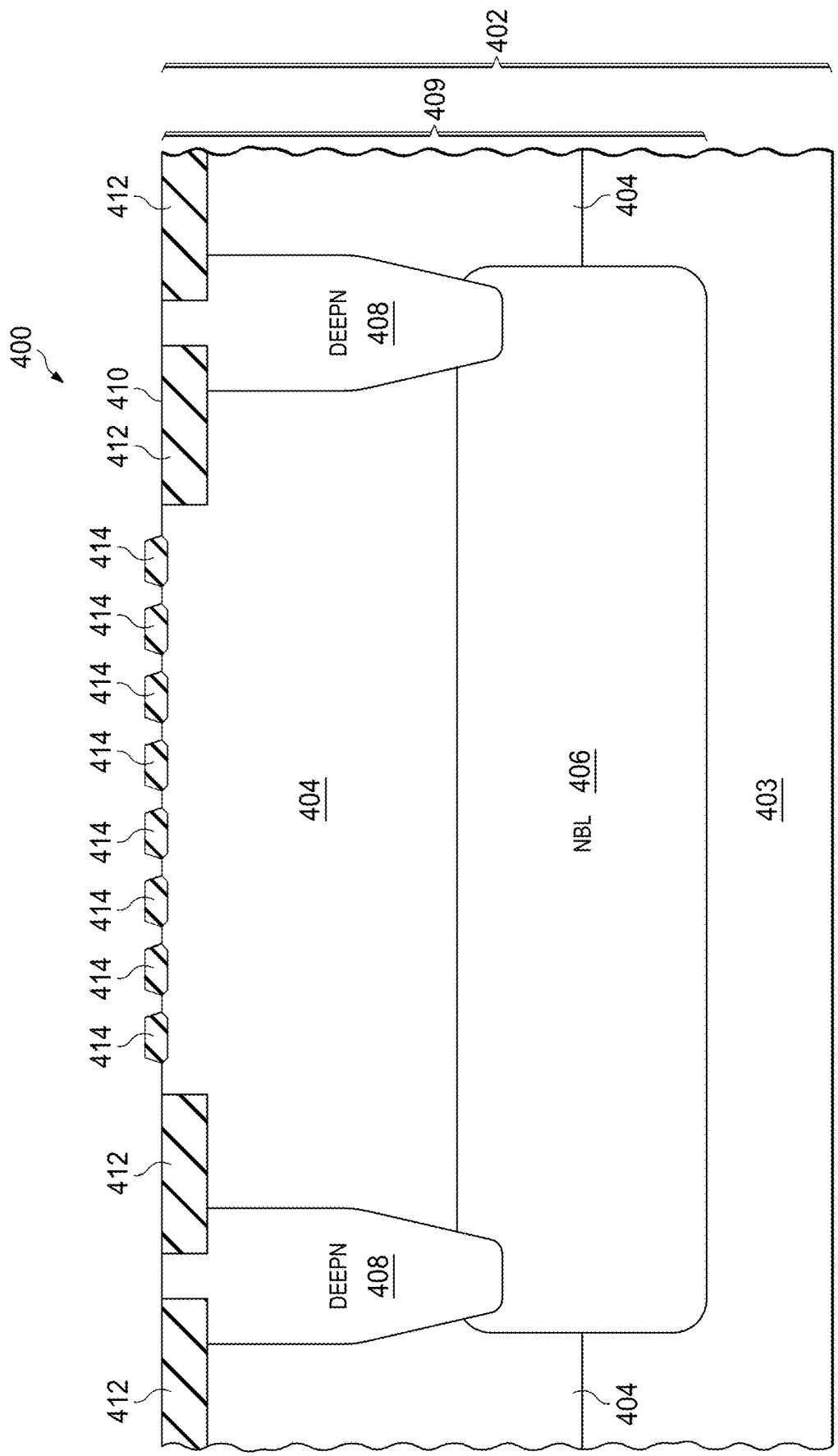

FIG. 4B depicts the IC 400 after formation of the two types of surface isolation structures-STI structures 412 and thin field relief oxide structures 414. The STI structures 412 may be formed by etching shallow trenches through a patterned composite mask (not shown), growing a thin oxide liner (not explicitly shown) on the etched surfaces, and depositing an oxide to overfill the trenches. The oxide may be deposited using a high-density plasma chemical-vapor deposition (HDP-CVD) process. Chemical mechanical polishing (CMP) may be used to remove the excess oxide and planarize the upper surface 410.

Formation of the thin field relief oxide structures 414 begins with deposition of an oxidation blocking mask (not shown), which in one implementation may be silicon nitride. The oxidation blocking mask is patterned to create openings over locations where the LOCOS structures are to be formed and a wafer containing the substrate is placed in an oxidizing atmosphere to grow the thin field relief oxide structures 414, followed by stripping off the oxidation blocking mask. In one implementation, the STI structures may be between about 300 nm to about 400 nm thick and the LOCOS structures may be between about 50 nm to about 150 nm thick.

Figure 4C:
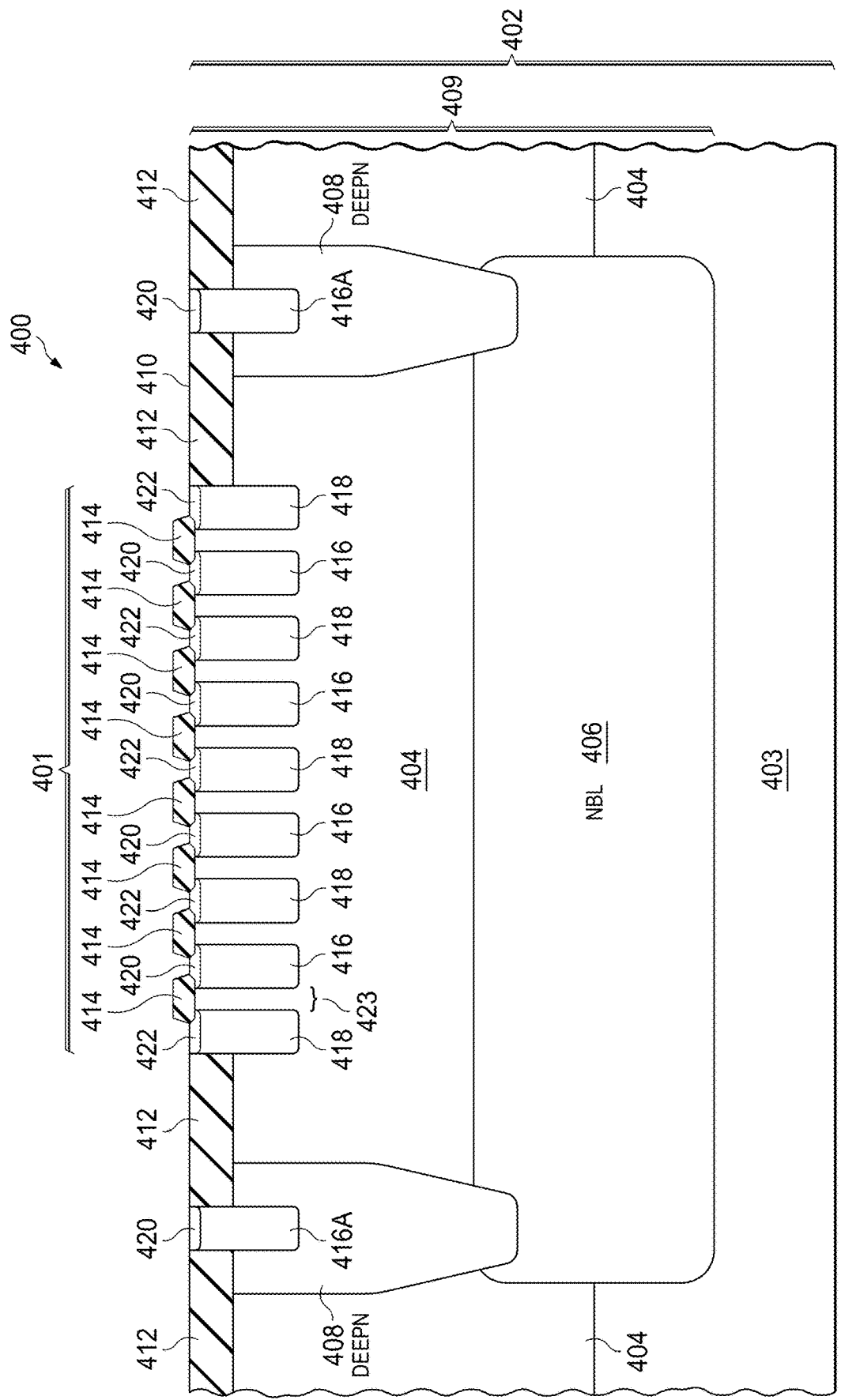

FIG. 4C depicts the IC 400 after the formation of the SNWs 416, the SPWs 418, the NSD regions 420, and the PSD regions 422 of the SNW/SPW diode 401. Prior to fabrication of the SNWs 416 and the SPWs 418, gate oxide and polysilicon field plates (not shown) may be formed, if desired. These polysilicon field plates may be formed at the same time as polysilicon gates are being formed for CMOS devices on the IC 400. In one implementation, a polysilicon layer (not shown) is deposited over the upper surface 410, then a photoresist mask (not shown) is deposited and patterned to cover regions where the polysilicon field plates and the CMOS polysilicon gates are desired and to expose the remaining regions of the IC. The exposed polysilicon is then etched through a gate/field plate mask to form the polysilicon field plates, which may extend partially over respective thin field relief oxide structures 414 and partially over portions of adjacent regions where the respective SNWs and the respective SPWs will be fabricated. The doping of the polysilicon field plates may be the same as other polysilicon gates that are fabricated at the same time. In some cases (not shown), for example when the thin field relief oxide is implemented using a step gate oxide, the SNW/SPW implants may be performed before the formation of the thin field relief oxide.

After fabrication of the polysilicon field plates, if done, an Nwell mask (not shown) is deposited and patterned, and SNWs 416 are implanted through this Nwell mask using multiple implants, which may use different energies and the same or different N-type dopants. The deepest and heaviest of these N-type implants may be an N-type channel stop implant to form an N-type channel stop region (not shown). A tank SNW 416A may also be implanted into the DEEPN diffusion region 408. In one implementation, the SNW 416 includes an N-type dopant, which may be phosphorous implanted using a dose of $2\times10^{12}/cm^2$ to $6\times10^{12}/cm^2$ with energies of 300 keV-500 keV. An N-doped channel stop region in the SNW 416 may include phosphorous implanted with a dose of $2\times10^{12}/cm^2$ to $6\times10^{12}/cm^2$ with energies of 100 keV-500 keV. In a non-limiting example the SNW 416 may have a peak concentration of n-type dopants in the SNW 416 at about 0.5 to 0.6 μm below the upper surface 410. Examples consistent with the disclosure are not limited to any particular isolation scheme. Other example isolation schemes include deep trench isolation, junction isolation, and similar other techniques.

After removal of the Nwell mask (not shown), a Pwell mask (not shown) is deposited and patterned, and SPWs 418 are implanted through the Pwell mask, again using multiple implants, which may have different energies and the same or different P-type dopants. The deepest and heaviest of these P-type implants can be a P-type channel stop implant to form a P-type channel stop region (not shown). In one implementation, the SPW 418 has a P-type dopant, which may include boron implanted with a dose of $1\times10^{13}/cm^2$ to $5\times10^{13}/cm^2$ with energies of 100 keV-700 keV. A P-doped channel stop region of the SPW 418 may include boron implanted with a dose of $3\times10^{12}/cm^2$ to $1\times10^{13}/cm^2$ with energies of 50 keV-500 keV. In a non-limiting example the SNW 416 may have a peak concentration of p-type dopants in the SPW 418 at about 0.7 μm below the upper surface 410. In some examples the SNW implants and SPW implants may result doping profile of the SNW 416 and the SPW 418 similar to the doping profile of the baseline SNW/SPW diode 700, thereby producing an N-type channel stop region (not shown) and a P-type channel stop region (not shown) having a depth that is consistent with the use of overlying STI structures such as STI structures 710 (FIG. 7), even though the isolation over the well space region is now the thin field relief oxide structures 414. Other doping profiles, including future-developed doping profiles, having a peak dopant concentration below the substrate surface are within the scope of the disclosure. It is noted here that the well space region 423 is defined in part by the separation between the edge of the Nwell mask (not shown) and the edge of the Pwell mask (not shown), each of which may extend over the LOCOS structure for a selected distance of between 0.2 μm and 1.0 μm.

An N-type source/drain mask (not shown) may then be formed and patterned, followed by an N-type implant to form NSD regions 420 within each of the SNWs 416. After removal of the N-type source/drain mask, a P-type source/drain mask (not shown) is similarly formed and patterned, followed by a P-type implant to form PSD regions 422 within each of the SPWs 418. In one implementation, the NSD regions 420 may include at least one shallow N-type implant, using any of phosphorus, arsenic, or antimony with a total dose of at least $1.0 \times 10^{15}/cm^2$ and an implant range of at most about 100 nm. The PSD regions 422 may include at least one shallow P-type implant using boron and/or indium with a total dose of at least $5 \times 10^{14}/cm^2$ and an implant range of at most about 100 nm. Additional information can be found in the '217 patent and the '380 patent. Removal of the P-type source/drain mask completes the doping processes for the SNW/SPW diode 401 and the isolation tank 409.

Figure 4D:
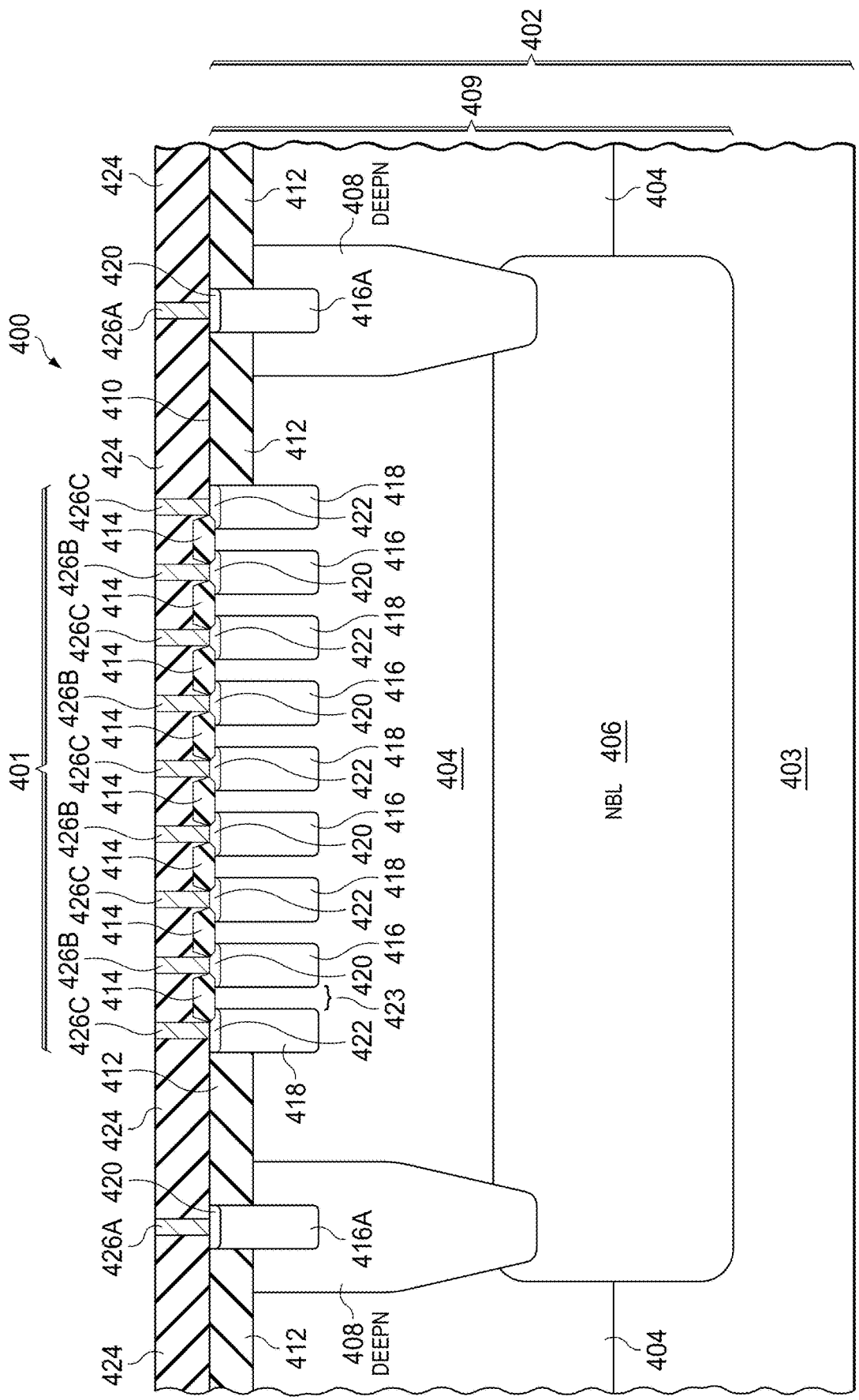

As illustrated in FIG. 4D, once all doping for the IC 400 is completed, interconnect dielectric 424 is deposited over the upper surface 410 of the substrate 402. The interconnect dielectric 424 may be a deposited silicon oxide or silicon nitride or a variation of either of these dielectric materials. Vias are formed, including a first set of vias 426A to contact the NSD regions 420 within the DEEPN diffusion region 408 of the isolation tank 409, a second set of vias 426B to contact the NSD regions 420 within the SNW/SPW diode 401, and a third set of vias 426C to contact the PSD regions 422.

As previously noted the first set of vias 426A may be coupled to the cathode, to the anode, or to a separate power node that may be available on the IC 400 to provide a voltage during operation, depending on the details of implementation in which the SNW/SPW diode 401 is used. The second set of vias 426B may be coupled to the cathode of the SNW/SPW diode 401, although ones of the second set of vias 426B that connect to the outermost SNW 416 in the SNW/SPW diode 401 may be absent or may be coupled to either the anode or to a separate power node. The third set of vias 426C may be coupled to the anode of the SNW/SPW diode 401.

Figure 5:
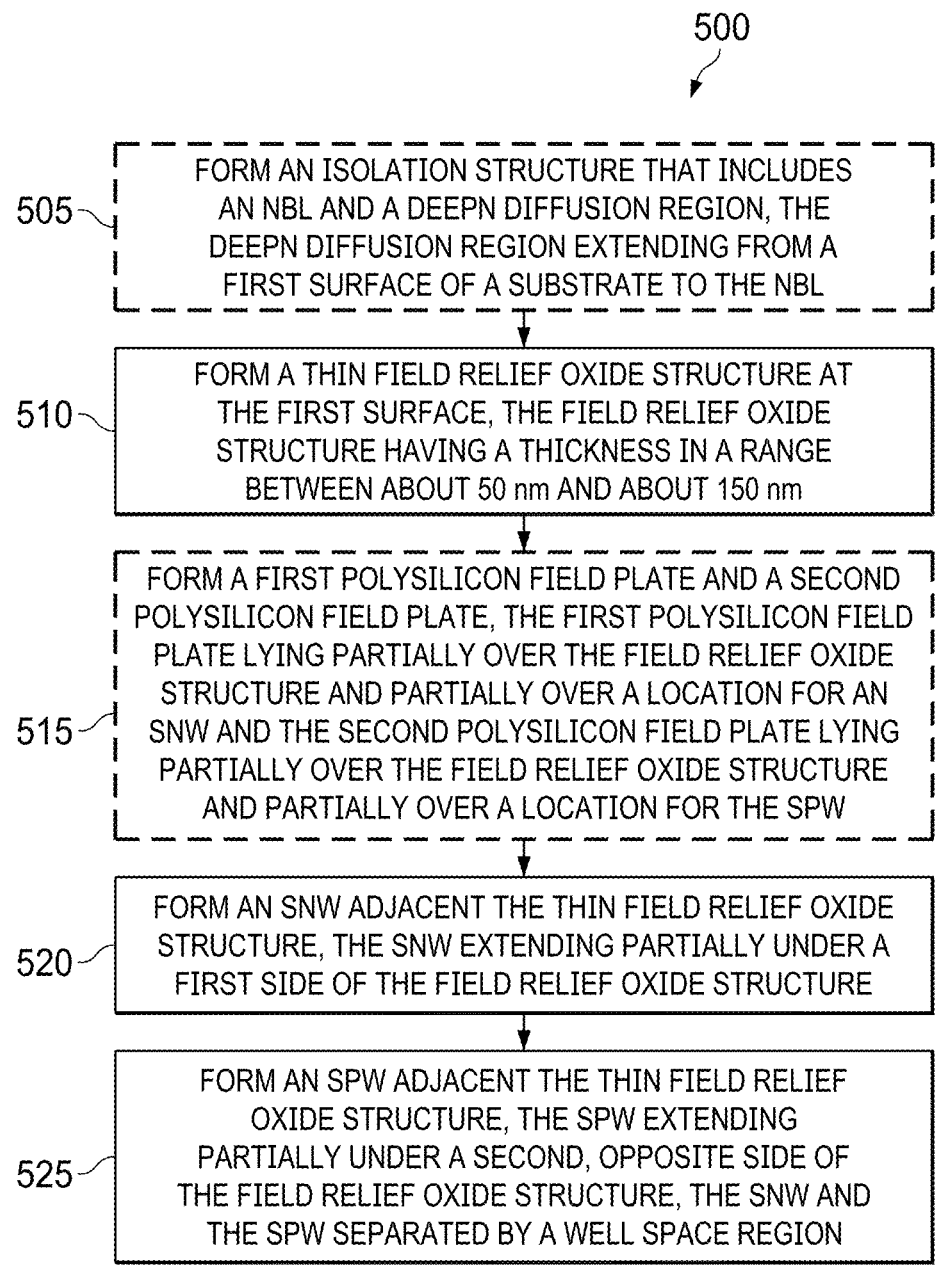
FIG. 5 depicts a method of fabricating an IC containing an avalanche diode according to an implementation of the disclosure.

FIG. 5 depicts a flowchart of a method 500 of fabricating an IC containing an SNW/SPW diode according to an implementation of the disclosure. Depending on how the avalanche diode (e.g. avalanche diode 401 in FIG. 4D) will be used, an isolation structure may optionally be formed 505, or may be omitted. The isolation structure (e.g. isolation tank 409 of FIG. 4D) includes an NBL (e.g., NBL (406, FIG. 4D) and a DEEPN diffusion region (408, FIG. 4D) that extends from the first surface to a perimeter of the NBL.

One or more thin field relief oxide structures (e.g. 414 in FIG. 4D) is/are formed 510 at the first surface. STI structures (e.g. 412 in FIG. 4D) may be formed within an area enclosed by the DEEPN diffusion region 408, in areas outside of and surrounding the DEEPN diffusion regions 406, and in other regions of the IC that are not intended to be part of the active area of the avalanche diode (401, FIG. 4D). The thin LOCOS structures or other thin field relief oxide structures may have a thickness in a range between about 50 nm and about 150 nm, while the STI structures may have a thickness in the range between about 300 nm and about 400 nm.

Optionally, polysilicon field plates are formed 515. A first polysilicon field plate may lie partially over a first side of a thin field relief oxide structure (e.g., 414, FIG. 4C) and partially over the substrate 402 adjacent the first side, e.g. a location for an SNW such as an adjacent one of the SNWs 416. A second polysilicon field plate may lie partially over an opposite second side of the thin field relief oxide structure and partially over the substrate 402 adjacent the second side, e.g. a location for an SPW such as an adjacent one of the SPWs 418.

An SNW (e.g., 416 in FIG. 4D) is formed 520 adjacent, and possibly extending under, a first side of the field relief oxide structure (e.g., 414 of FIG. 4D), and may extend partially under the first side of the field relief oxide. Multiple implants may be used to form the SNW, including an N-type channel stop implant to form an N-type channel stop region having a maximum N-dopant concentration below the surface of the substrate. An NSD region (e.g., 420 in FIG. 4D) is formed in exposed silicon over the SNW.

An SPW (e.g., 418 in FIG. 4D) is formed 525 adjacent, and possibly extending under, a second side of the thin field relief oxide structure, and may extend partially under the second side of the thin field relief oxide structures at the first surface (e.g., 410 of FIG. 4D). Multiple implants may be used to form the SPW, including a P-type channel stop implant to form a P-type channel stop region having a maximum P-dopant concentration below the surface of the substrate. A PSD region (e.g., 420 in FIG. 4D) is formed in exposed silicon over the SPW. The SNW and the SPW are separated by a well space region having a first width that may be between about 0 μm and about 1.3 μm, wherein the well space region is defined in part by edges of the masks used to implant the SNW and the SPW, including diffusion from activation or anneal steps. The outermost SNW in the avalanche diode may be separated from the adjacent SPW by a well space region having a second width that is greater than the first width. These features may form an avalanche diode having a breakdown voltage between about 12 V and about 35 V. For higher breakdown voltages in an avalanche diode, a larger well space region may be used.

Although the integrated circuit described herein has included a P-type substrate and an N-type isolation structure, the IC may also be fabricated using an N-type substrate and a P-type isolation structure. Additionally, although the described circuits are directed to protecting a high-side power FET in a DC-DC converter, the disclosed diode may be used in many other circuits in which a power FET needs protection from over-voltages that might cause breakdown in the power FET.

Applicants have disclosed an avalanche diode that is an SNW/SPW diode including a thin LOCOS structure or other thin field relief oxide structure over a well space region. The doping of the avalanche diode may be similar to fabrication formulas used in analogous structures when using an STI structure over the well space region. The configuration as disclosed provides a greater distance between the oxide/semiconductor interface under the thin field relief oxide structure and the impact ionization region of the diode. The disclosed avalanche diode may be coupled in parallel with a power FET in circuits in which the power FET is to be protected from over-voltages. The disclosed SNW/SPW diode and the use of the disclosed SNW/SPW diode in circuits may provide one or more of the following advantages: simplified ability to design an avalanche diode with a selected voltage to protect a particular power FET in an active clamp design, lower cost solutions that eliminate the need to include DC blocking devices and multiple Zener diodes, networks having overall tighter tolerances, and ease of use from the simplified design and fewer circuit components.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. A method of fabricating an integrated circuit comprising:
   forming a thin field relief oxide structure in a semiconductor substrate;
   forming a shallow N-type well (SNW) in the semiconductor substrate adjacent a first side of the thin field relief oxide structure; and
   forming a shallow P-type well (SPW) in the semiconductor substrate adjacent an opposite second side of the thin field relief oxide structure, the SNW and the SPW each having a peak dopant concentration under the thin field relief oxide structure and being spaced apart under the thin field relief oxide structure by the semiconductor substrate.

2. The method as recited in claim 1 in which:
   forming the SNW includes forming SNW fingers that extend in parallel along a surface of the semiconductor substrate; and
   forming the SPW includes forming first SPW fingers and second SPW fingers, the first SPW fingers extending in parallel with the SNW fingers along the surface of the semiconductor substrate, the second SPW fingers extending perpendicular to the first SPW fingers along the surface to enclose the SNW fingers on four sides.

3. The method as recited in claim 2 in which:
   forming the SNW fingers includes forming an N-type channel-stop region through an Nwell mask and forming an NSD region over the SNW fingers through an NSD mask; and
   forming the SPW fingers includes forming a P-type channel-stop region through a Pwell mask and forming a PSD region over the SPW fingers through a PSD mask, the Nwell mask and the Pwell mask extending over the thin field relief oxide structure for a selected distance.

4. The method as recited in claim 2 in which a subset of the SNW fingers and a subset of the SPW fingers are separated by a first width, and an outermost SNW finger is separated from an adjacent SPW finger by a second width that is greater than the first width.

5. The method as recited in claim 2 including electrically coupling an outermost SNW finger to a DC bias node.

6. The method as recited in claim 1 including forming a first polysilicon field plate and a second polysilicon field plate, the first polysilicon field plate lying partially over the thin field relief oxide structure and partially over the SNW and the second polysilicon field plate lying partially over the thin field relief oxide structure and partially over the SPW.

7. The method as recited in claim 1 including forming an isolation structure that includes an N-type buried layer (NBL) and a DEEPN diffusion region, the DEEPN diffusion region extending from a surface of the semiconductor substrate to the NBL.

8. The method as recited in claim 7 including forming an STI structure in the semiconductor substrate between the isolation structure and SNW fingers that extend in parallel along a surface of the semiconductor substrate.

9. The method as recited in claim 1 in which the thin field relief oxide structure has a thickness in a range between about 50 nm and about 150 nm and the SNW and the SPW are spaced apart by a width between about 0 μm and about 1.3 μm, thereby forming an avalanche diode having a breakdown voltage between about 12 V and about 35 V.

10. A method of forming an integrated circuit comprising:
    forming a diode in or over a semiconductor substrate, the forming including:
    forming a P-type well and an N-type well extending into a semiconductor substrate and spaced apart by a well space region;
    forming an anode terminal on the P-type well and a cathode terminal on the N-type well;
    forming a shallow-trench isolation (STI) structure that surrounds the anode terminal and the cathode terminal; and
    forming a field relief oxide structure between the anode terminal and the cathode terminal, the field relief oxide structure having a thickness no greater than one-half a thickness of the STI structure.

11. The method as recited in claim 10, wherein a depletion region extends from the N-type well to the P-type well.

12. The method as recited in claim 10, further comprising forming a first field plate on the field relief oxide structure and extending over the N-type well, and a second field plate on the field relief oxide structure and extending over the P-type well.

13. The method as recited in claim 10, wherein the diode is configured to clamp a voltage at a drain terminal of a power N-type field effect transistor (NFET).

14. The method as recited in claim 13, wherein the cathode terminal is directly connected to the drain terminal.

15. A method of forming an electronic device, comprising:
    forming a shallow P-type well (SPW) in a semiconductor substrate, the SPW providing an anode of a diode;
    forming a shallow N-type well (SNW) in the semiconductor substrate and spaced apart from the SPW, the SNW providing a cathode of the diode, the SNW separated from the SPW by a well space region;
    forming a field relief oxide structure at a surface of the semiconductor substrate over the well space region;
    forming an N-doped channel-stop region within the SNW with a peak dopant concentration below the surface; and
    forming a P-doped channel-stop region within the SPW with a peak dopant concentration below the surface.

16. The method as recited in claim 15 in which the field relief oxide structure has a thickness in a range between about 50 nm and about 150 nm.

17. The method as recited in claim 15 in which:
    the SNW is one of a plurality of SNW fingers that extend in parallel along the surface of the semiconductor substrate; and the SPW is one of a plurality of parallel SPW fingers interleaved with the SNW fingers, and a first perpendicular SPW finger connects first ends of the parallel SPW fingers and a second perpendicular SPW finger connects second ends of the parallel SPW fingers.

18. The method as recited in claim 15 in which the semiconductor substrate includes a P-type bulk silicon layer and a P-type epitaxial layer in which the SNW and SPW are located.

* * * * *